United States Patent [19]

Stickel

[11] 4,208,639
[45] Jun. 17, 1980

[54] CONSTANT CURRENT SOURCE STABILIZED SEMICONDUCTOR OSCILLATOR

[75] Inventor: Tedd Stickel, Chalfont, Pa.

[73] Assignee: Solid State Scientific Inc., Montgomeryville, Pa.

[21] Appl. No.: 916,224

[22] Filed: Jun. 16, 1978

[51] Int. Cl.² ............................................. H03B 5/36
[52] U.S. Cl. ............................ 331/116 FE; 331/175; 331/177 R
[58] Field of Search ............... 331/116 R, 51, 177 R, 331/183, 108, 116 FE, 109, 175; 58/23 R, 23 A, 23 AC

[56] References Cited

U.S. PATENT DOCUMENTS

| | | | |
|---|---|---|---|
| 3,144,619 | 8/1964 | Cochran | 331/109 |
| 4,000,459 | 12/1976 | Little | 331/183 |
| 4,013,979 | 3/1977 | Vittoz | 331/116 R |
| 4,096,444 | 6/1978 | Fellrath | 331/116 R |
| 4,096,496 | 6/1978 | Namata et al. | 331/116 R |
| 4,101,838 | 7/1978 | Aihara et al. | 331/51 |

Primary Examiner—Siegfried H. Grimm
Attorney, Agent, or Firm—Frailey & Ratner

[57] ABSTRACT

A crystal controlled oscillator has a substantially stable frequency in an environment of wide power supply potential changes. A first CMOS device of a pair is coupled to a crystal network and operates as a substantially small signal linear amplifier. A second CMOS device of the pair forms a constant current source for the first device by means of a plurality of diodes coupled in series circuit between two terminals of the second device to produce a substantially constant biasing potential for the second device only when the potential of the power supply exceeds the value of the diode drop potentials. In this manner, the voltage across the oscillator is relatively independent of power supply voltage changes to provide frequency stability over those changes.

8 Claims, 4 Drawing Figures

CONSTANT CURRENT SOURCE STABILIZED SEMICONDUCTOR OSCILLATOR

BACKGROUND OF THE INVENTION

A. Field of the Invention

This invention relates to the field of art of oscillators stabilized with respect to varying supply voltage values.

B. Prior Art

Many prior schemes have been used to achieve oscillations suitable for digital counting operations such as those used in clocks. However, such former techniques possess particular shortcomings with respect to frequency stability over a wide range of supply voltage values as is commonly experienced in the automobile clock circuit. A wide operating voltage range occurs in automobile environments due to reasons such as (1) severe current drain demends on the battery during cold weather engine starting attempts, (2) poor regulator performance, and (3) generator deficiencies with increasing age.

One of the basic problems inherent in the operation of the prior art devices is the stabilization of the operation point of the active amplification device in the presence of 6 to 1 changes in the supply voltage. Reliable start-up behaviour at extremely low supply voltages, as for example, 3 volts, is another critical shortcoming of prior devices. A further performance shortcoming exists with respect to the purity of the sinusoidal waveform developed by prior art devices since these devices utilize large signal swings in the active devices of the oscillator network. Large signal amplification involves non-linearities and clipping at signal extremes. Another shortcoming of prior art devices is that the current in the oscillator has varied as approximately the square of the supply voltage.

SUMMARY OF THE INVENTION

An oscillator having a substantially stable frequency in an environment of wide power supply potential excursions of about six to one. A first CMOS semiconductor device is coupled by way of first and second modes to the oscillator network with a 180° phase shift between the nodes. A constant current source for providing full operating current for the oscillator network includes a second CMOS semiconductor device constantly connected only between the second node and the power supply and free of a feedback loop with the oscillator network. A plurality of diodes are coupled in series circuit between two terminals of the second device one of which is a gate terminal. A third CMOS device is connected across the plurality of diodes for producing a substantially constant biasing potential for the second device when the potential of the power supply exceeds the value of the total drop potentials. In this manner, the voltage at the first and seconds nodes is without feedback maintained relatively independent of the about six to one potential excursions of the power supply potential thereby to produce frequency stability over those excursions.

DETAILED DESCRIPTION

Figure 1:
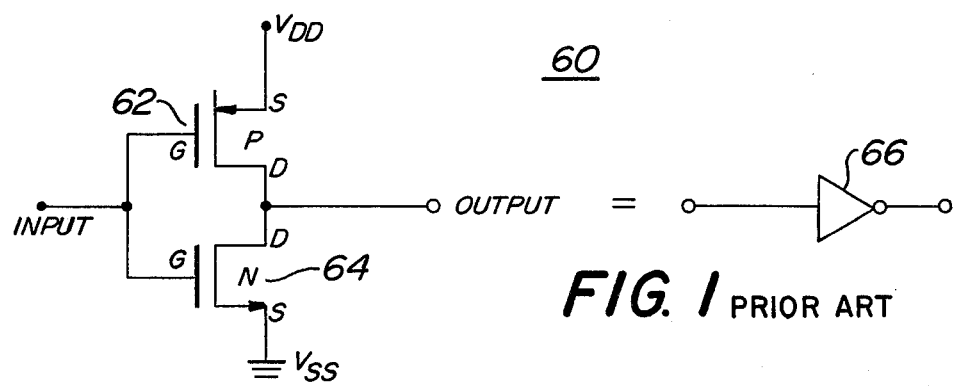
FIG. 1 illustrates schematically a conventional CMOS inverter using a p-channel and a n-channel field effect transistor.

Complementary Metal Oxide Semiconductor (CMOS) oscillator circuits use a standard CMOS inverter stage as shown in FIG. 1. This stage is comprised of a n-channel device 64 which serves as a common source type amplifier and a p-channel device 62 which effectively performs the role of a dynamic load resistor. The gates of devices 62 and 64 are joined to form a common input terminal and the drain terminals of both devices are joined to form the output terminal of the amplifier stage. These devices so connected are represented by the inverter symbol 66 also shown in FIG. 1.

Figure 2:
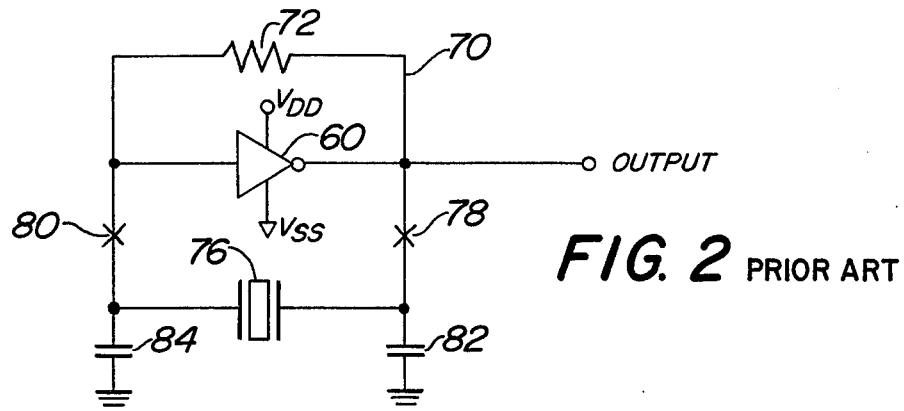
FIG. 2 illustrates schematically the inverter of FIG. 1 used as an amplifier in a conventional Pierce crystal oscillator circuit.

FIG. 2 shows a conventional CMOS oscillator 70 using a Pierce crystal configuration in which crystal 76 is placed in the output to input feedback loop of amplifier 60. Capacitors 82 and 84 are part of a standard Pierce configuration. Amplifier 60 provides 180 degrees of phase shift from input to output terminals of the crystal network thereby making the total loop phase shift 360 degrees as required to sustain oscillations. In addition, resonant circuit losses are compensated for by way of the amplifier gain.

If the power supply to amplifier 74 varies, the amplifier would undergo severe shifts in its quiescent operating point. As a result of this shift, the gain of amplifier 60 would alter thereby introducing output amplitude waveform changes and thus input amplitude waveform changes. In so doing, the phase shift through amplifier 60 would undergo an undesirable deviation from a stabilized value. However, this phase shift occuring in amplifier 60 would be compensated for by a corresponding phase shift change (frequency deviation) incurred by crystal 76 and its associated oscillatory network.

If amplifier 60 of FIG. 1 of oscillator 70 is to function over an extremely wide voltage range ($3 \leq V_{DD} \leq 18$ volts), as is common in an automobile environment, then the active CMOS device must be fabricated to yield sufficient high $G_m$ to enable reliable start-up behavior at the low end of the supply voltage range (3 volts). A second condition which must be satisfied to guarantee oscillations involves sufficient supply potential $V_{DD}$ which is dictated by the relation $$V_{DD} > V_{TPX} + V_{TNX} \tag{1}$$

$V_{TPX}$ is the threshold voltage of p-channel device 62 and $V_{TNX}$ is the threshold voltage of n-channel device 64. Tyically, $$V_{TPX} + V_{TNX} \approx 2.5 \text{ to } 3.0 \text{ volts} \tag{2}$$

∴, $V_{DD} \geq 3.0$ volts for oscillator startup

With regard to transconductance, $G_m$, is proportional to W/L for each device 62 and 64. A requirement exists to fabricate devices of extremely large W/L ratios to force $G_m$ high at low supply potentials. This requirement produces high current drain at supply potentials in the normal operating range of 12 to 14 volts. In addition, since the W/L ratios of devices 62, 64 are high, increased voltage amplification gains ($A_v$) result since $$A_v = G_m R_o$$

where $R_o$ is the equivalent network output resistance.

This increased amplification results in large inverter output signal swings over the supply voltage range. The dynamic operating point travels over a larger portion of the active devices $V_{DS}-I_{DS}$ characteristic and therefore into regions of increased nonlinearity. Signal distortion results in the form of a departure from true sinusoidal function. These amplitude distortions and related phase shift distortions which result when the crystal output is passed through the inverter cause shifts in crystal output frequency. Hence, oscillators employing CMOS stages of the type shown in FIG. 1 have inherently poor frequency stability as a function of power supply potential variations. Typical values of frequency stability are 7 to 8 parts per million for a 5 to 12 variation in supply potential, for a 4.2 MHz crystal.

As a result, amplifier design goals are in conflict when the amplifier is in an environment of wide power supply ranges such as in a car clock. Geometrical shapes of CMOS devices which yield high transconductance even at low supply potentials are different from the physical dimensions demanded for low quiescent currents at normal operating voltages.

Figure 3:
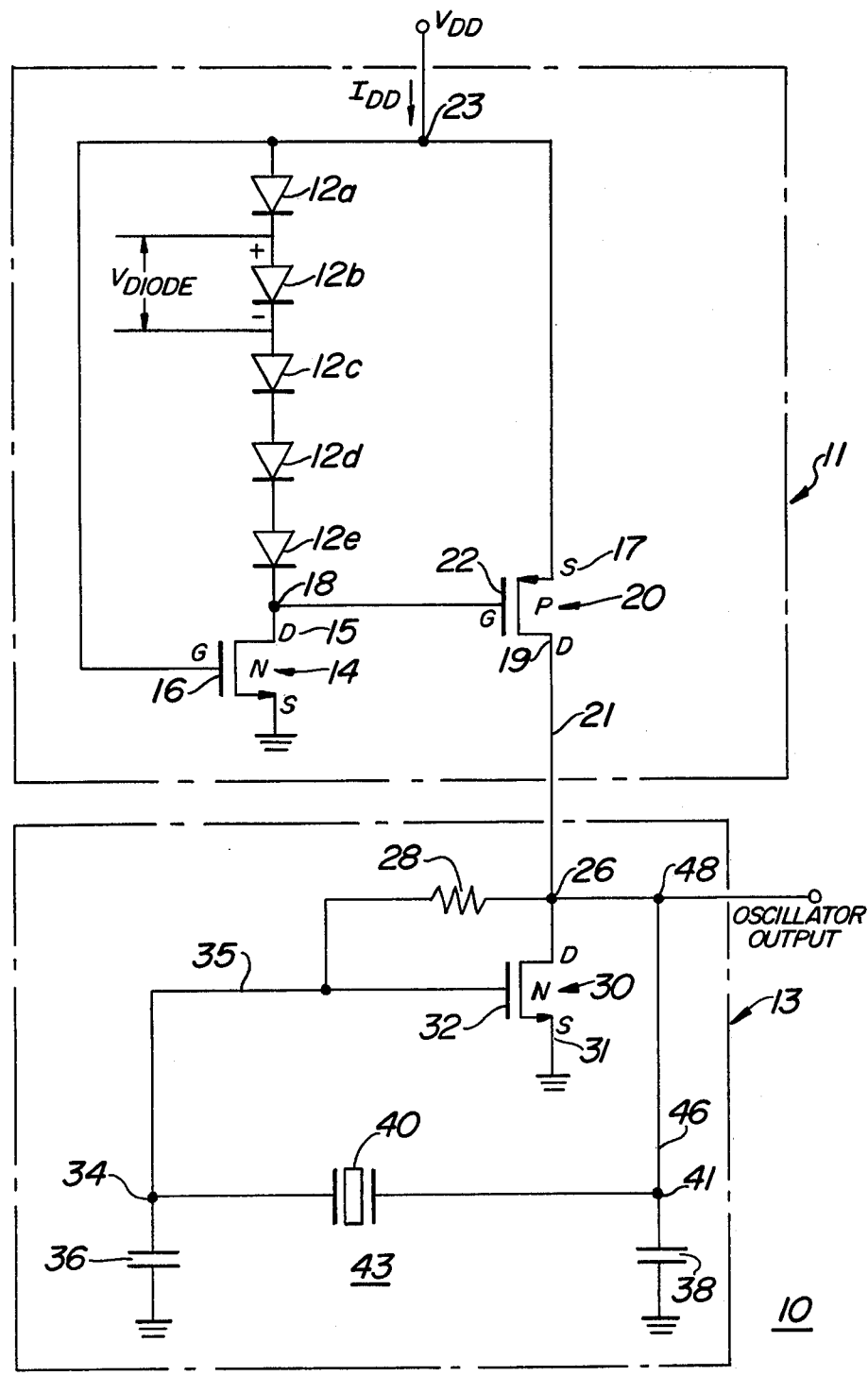
FIG. 3 illustrates schematically the CMOS oscillator in accordance with the present invention.

Referring to FIG. 3, oscillator 10 in overcoming the limitations of the prior art comprises crystal 40 and capacitors 36 and 38 as the frequency determining network. Devices 20 and 30 respectively comprise a p-channel and n-channel CMOS pair and operate in conjunction with resistor 28 to provide the required 180° of phase shift from node 34 to node 26. The waveform at node 26 is applied to oscillator output load terminal 48 and then applied by wire 46 to node 41 of crystal network 43. Oscillatory voltages developed by resonant network 43 are conveyed to gate 32 of n-channel 30 by way of conductor 35. Channel source terminal 31 is connected to ground potential thereby providing a DC drain to source bias current path from $V_{DD}$ source 23, through devices 20 and 30 to terminal 31.

Stability of the operating point on N-channel 30 characteristics is provided by section 11. Section or network 11 provides a constant current source for the current flowing through conductor 21 with the network comprising p-channel device 20, n-channel device 14 and five diodes 12a-e. These diodes are connected in series between nodes 23 and 18 where node 18 is the intersection of drain terminal 15 of n-channel device 14 and gate terminal 22 of p-channel device 20. Supply potential $V_{DD}$ is connected to source terminal 17 of p-channel 20 and gate terminal 16 of n-channel 14.

The series network of diodes 12a-e and n-channel 14 comprise the equivalent of a diode-resistor network connected between the supply potential and ground. If a minute quiescent current is maintained through a single p-n junction diode, the terminal to terminal diode voltage drop will be maintained in the vicinity of 600 to 650 millivolts. Connection of five diodes in series as shown in network 11 yields a total drop of approximately 3 volts between nodes 23 and 18. Any additional voltage difference between $V_{DD}$ and 3 volts is dropped across n-channel device 14 between drain 15 and ground. Accordingly, device 14 serves as a high impedance load for diodes 12a-e.

Diodes 12a-e are used to generate a substantially constant gate to source biasing potential for p-channel 20 when the supply potential has exceeded the value of five diode drop potentials or 3 volts. The current from source to drain of device 20 flowing through wire 21 is directly proportional to the square of the p-channel's gate to source potential $V_{GS}$. Hence, the bias current flowing into node 26 from the drain terminal of device 20 will be constant and independent of variations in supply potential. The quantity of the diodes utilized in the biasing section 11 is dependent upon the threshold voltage of device 20, the required constant current source's current magnitude and the minimum power supply potential.

The advantages of substantially constant current source section 11 are as follows. The voltage on input and output nodes 34,26 respectively of oscillator section 13 will be relatively independent of power supply voltage changes. The amplitudes of the voltage waveforms at these two nodes will alter very little over the desired supply potential range from 3 to 18 volts. Since these waveforms are of reduced amplitude (2-3) volts peak to peak) minor deviations in phase shift through linearly biased amplifier 30 will not occur since the quiescent bias current is maintained constant and indepedent of power supply variations due to the action of the constant current bias supply of section 11. Oscillator 10 is extremely stable over supply voltage variations in terms of frequency stability. This stability is nominally less than one part per million which is nearly an order to magnitude improved stability when compared to the prior art.

Therefore, the oscillator 10 provides 1. very low M.O.V. (Minimum Operation Voltage) $\cong 3.0$ volts.

2. extremely low $I_{DD}$ (approx. 200 microamperes at 12 volts $V_{DD}$)

3. extremely stable frequency versus supply voltage operation as given by:

$$(\Delta f/f) \cong 1 \text{ ppm for 5 to 12 VDC}$$

To achieve this performance, p-channel 20 and n-channel 30 are chosen with very large width/length (W/L) ratios to obtain sufficient $G_m$ to enable start-up of oscillations at the minimum supply potential of approximately 3 volts. $V_{DD}$ must be only greater than the largest threshold voltage $V_{TX}$ of either p-channel 20 or n-channel 30 in order for the amplifier to become linearly biased. Oscillations become possible upon such linear biasing ($V_{DD}=1.2-1.5$ volts nominal) but typically oscillations will not occur until $V_{DD}=2-3$ volts where $G_m$ becomes large enough for oscillations ($G_m$ is $\alpha V_{DD}$). N-channel 20 is biased to operate in the constant current region of its $V_{DS}-I_{DS}$ characteristics and at very small quiescent drain current. In so doing, the waveform at drain terminal of device 30 will reach a maximum peak amplitude of only several volts above ground regardless of supply voltage magnitude.

In this manner and as compared with the prior art, n-channel 30 may now perform as an extremely small signal linear amplifier in the presence of large supply voltages thereby exhibiting excellent linear amplification characteristics. This behavior from the amplifier produces an undistorted sinusoidal waveform at output node 26. The voltage at oscillator input and output by not changing over $V_{DD}$ together with undistorted sinusoidal waveform provides an amplifier having stable phase shift characteristics independent of supply voltage deviations. Hence, crystal 40 is not called upon to produce frequency deviations to compensate for phase shift alterations in the amplifier. In addition, since the output swing of the oscillator is small, crystal power consumed is lower thereby increasing the lifetime of crystal 40 and the frequency stability of the crystal with age.

Figure 4:
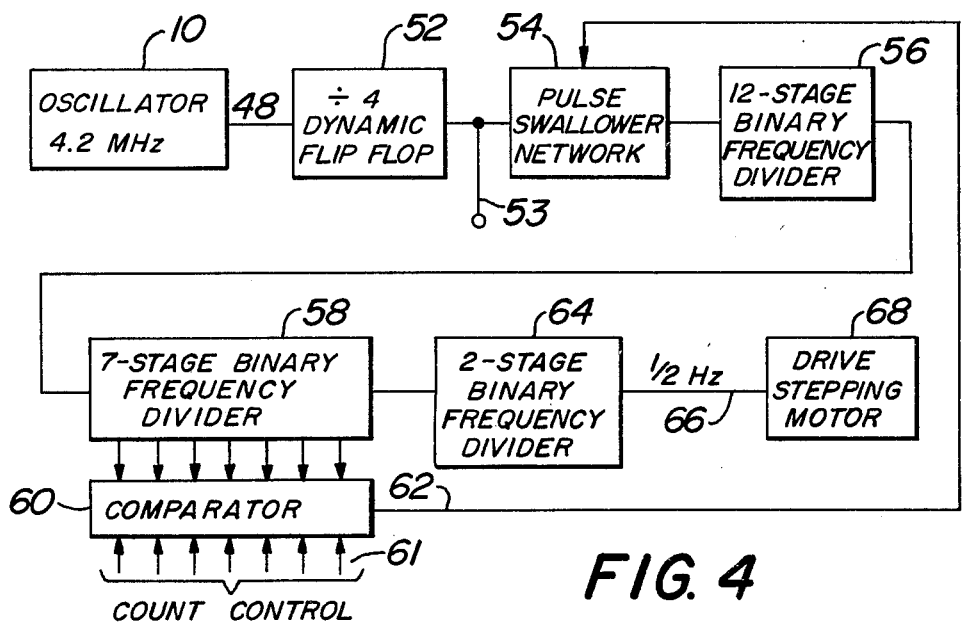
FIG. 4 illustrates in block diagram form the oscillator of FIG. 3 embodied in an automobile clock circuit.

Referring now to FIG. 4, oscillator output 48 from oscillator 10 is used in a digitally tuned clock circuit for car clocks or domestic clocks. Output 48 is divided by four in flip-flop 52 to yield a 1 MHz test signal 53 which is utilized for tuning the circuit. The output of divide by four stages 52 drives a pulse swallower network 54. The output of network 54 is divided down in frequency by a 12 stage binary counter 56, a 7 stage binary counter 58 and a 2 stage binary counter 64 which outputs a 0.5 Hz signal 66 used to drive stepping motor 68. The ouputs of the 7 stage counter 58 are compared to seven count control inputs 61 which are established high or low logic levels as determined by an external test device monitoring the frequency at test point 53. Crystal oscillator 10 is tuned so that output 48 is slightly higher than the exact frequency of 4194304 Hz which yields exactly 0.5 Hz at the output of divider 64 to drive stepping motor 68. The test measurement device computes the correct count control logic levels 61 to enable comparator 60 to output enable pulses on line 62 which operate pulse swallower network 54. Network 54 is effective to inihbit predetermined input pulses from reaching the following 12 stage binary counter 56. In this manner, an effective lowering of the actual crystal frequency may be achieved.

What is claimed is:

1. An oscillator having a substantially stable frequency in an environment of wide power supply potential excursions of about six to one comprising
  an oscillator network,
  a first CMOS semiconductor device coupled by way of a first and second node to the oscillator network to provide a 180° phase shift between said nodes,
  constant current source means for providing full operating current for said oscillator network including a second CMOS semiconductor device constantly connected only between said second node and said power supply and free of a feedback loop with said oscillator network, a plurality of diodes coupled in series circuit between two terminals of said second semiconductor device one of which is a gate terminal and a third CMOS semiconductor device connected across said plurality of diodes for producing a substantially constant biasing potential for said second device only when the potential of said power supply exceeds the value of the plurality of unidirectional device drop potentials whereby the voltage at said first and second nodes is without said feedback maintained relatively independent of the about six to one potential excursions of said power supply potential thereby to produce frequency stability over those excursions.

2. The oscillator of claim 1 in which said oscillator network is crystal controlled.

3. The oscillator of claim 2 in which said first and second devices respectively comprise a n-channel and an p-channel CMOS pair of devices whereby the n-channel device operates as a substantially small signal linear amplifier.

4. The oscillator of claim 3 in which there is provided a resistor coupled between said first and second nodes for a substantially constant biasing potential for said first device.

5. The oscillator of claim 4 in which the drains of the n-channel and the p-channel devices are connected together to form the second node and the gate of the n-channel and one side of the crystal are coupled together to form the first node.

6. The oscillator of claims 2, 3, 4 or 5 in which said plurality of diodes are coupled between the source and gate of said second CMOS device, said third CMOS device having gate and drain terminals connected across said plurality of diodes and a source terminal coupled to a reference potential for providing a high impedance load for said plurality of diodes.

7. The oscillator of claim 6 in which said first and second devices are chosen with very large width/length ratios to obtain sufficient $G_m$ to enable start up of oscillation at the voltage produced at said first and second nodes by said source means.

8. The crystal controlled oscillator of claim 6 in which there is provided a cascaded chain of flip-flops forming a frequency divider coupled to said second node, a pulse swallower network coupled to said cascaded chain for adjusting the frequency of the pulses produced by said cascaded chain, an analog clock having a motor driver connected to said frequency divider for supplying current pulses, and a stepper motor responsive to said current pulses for advancing the hands of an analog clock.

* * * * *